(12) United States Patent
Feiweier

(10) Patent No.: US 7,242,193 B2
(45) Date of Patent: Jul. 10, 2007

(54) MAGNETIC RESONANCE CYLINDRICAL BODY COIL AND METHOD FOR GENERATING A HOMOGENEOUS RF FIELD

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/404,150

(22) Filed: Apr. 14, 2006

(65) Prior Publication Data

US 2006/0255800 A1 Nov. 16, 2006

(30) Foreign Application Priority Data

Apr. 14, 2005 (DE) ...................... 10 2005 017 310

(51) Int. Cl.
*G01V 3/00* (2006.01)
(52) U.S. Cl. ...................... 324/318; 324/322
(58) Field of Classification Search ............... 324/318, 324/322
See application file for complete search history.

(56) References Cited

U.S. PATENT DOCUMENTS

| 6,900,636 | B2 | 5/2005 | Leussler |
| 6,982,554 | B2 * | 1/2006 | Kurpad et al. ............... 324/318 |
| 6,995,561 | B2 * | 2/2006 | Boskamp et al. ........... 324/318 |
| 7,049,818 | B2 * | 5/2006 | Rinneberg et al. .......... 324/318 |
| 7,075,302 | B2 * | 7/2006 | Zhu ........................... 324/318 |
| 2005/0189940 | A1 | 9/2005 | Feiweier et al. |

* cited by examiner

*Primary Examiner*—Louis M. Arana
(74) *Attorney, Agent, or Firm*—Schiff Hardin LLP

(57) ABSTRACT

A magnetic resonance apparatus has a cylindrical body coil composed of a number of resonator segments distributed around the circumference and a control device for separate activation of the individual resonator segments. The resonator segments are electromagnetically decoupled from one another. The activation generates a radio-frequency magnetic field inside the coil for spin excitation in an examination volume. The resonator segments are activated such that the excitation field is generated only in at least one first sub-volume forming the examination volume, and at least one second sub-volume, that is not to be excited, is essentially free of the excitation field.

10 Claims, 2 Drawing Sheets

MAGNETIC RESONANCE CYLINDRICAL BODY COIL AND METHOD FOR GENERATING A HOMOGENEOUS RF FIELD

BACKGROUND OF THE INVENTION

1. Field of the Invention

The present invention concerns a magnetic resonance apparatus of the type having a cylindrical body coil formed by a number of resonator segments distributed around the circumference and a control device for separately activating of the individual resonator segments (the resonator segments being electromagnetically decoupled from one another) so as to generate a radio-frequency field inside the coil for magnetic resonance (MR) spin excitation in an examination volume.

2. Description of the Prior Art

Magnetic resonance tomography is one of the imaging methods in medical diagnostics that uses the interaction of an external field (here a magnetic field) with the human body for imaging. Known magnetic resonance apparatuses have a (normally) cylindrical body coil that is formed by a number of resonator segments distributed around the circumference. Each resonator segment normally is formed of at least one capacitor as well as a conductor element that proceeds parallel to the longitudinal axis of the surrounding basic field magnet. A conductor segment is appropriately fashioned as a band conductor; the multiple conductor segments being distributed around the circumference of the body coil. Coils are known in which the resonator segments are electromagnetically decoupled from one another, such that each resonator segment can be separately activated by a control device.

A homogeneous, radio-frequency excitation magnetic field that serves for tilting the nuclear spins in the patient to be examined is now generated inside the body coil by the body coil or the resonator segments thereof. The body coil can also be oval in cross-section or deformed in another manner as an alternative to the cylindrical shape. The design and the functioning of such a magnetic resonance system is known and does not have to be explained in detail herein.

For implementing a series of magnetic resonance examinations, standard localized saturation pulses are used that are generated via the body coil so that selected body regions do not appear in the magnetic resonance image. This is necessary, for example, for suppression of motion artifacts, for example in a spinal column acquisition in which the abdominal wall moving due to respiration (which would lead to artifacts in the image region of the spinal column) is suppressed with localized saturation pulses. A further circumstance that can lead to image artifacts is fold-over artifacts in the phase encoding direction when, for time reasons, the entire excited imaging region is not to be acquired with a sufficiently dense sampling of k-space.

Such a saturation pulse is typically integrated into the excitation sequence and is activated prior to the actual excitation pulse that serves for the generation of the excitation field. Gradient pulses are activated in parallel with the saturation pulse; the spatial selectivity is achieved in this manner. This saturation pulse serves to specifically destroy or to dephase the magnetization in a specific volume. Due to the saturation pulse, the magnetization in the excited examination volume region exists in the transversal plane and there is cancelled therein by one or more subsequently-activated gradient pulses ("spoiler pulses"). The actual excitation pulse that serves for the actual image acquisition subsequently ensues. The entire examination volume or a volume slice is thereby excited by the body coil by an RF field being generated in the entire interior of the body coil. A spin excitation is possible, however, only in the non-saturated region of the examination volume, thus in the region that is not saturated by the saturation pulse; no spin excitation can occur in that region. This means that, in the prior art, a double sequence always ensues for acquisition of an image, namely a first excitation sequence to provide the saturation pulse in order to generate a saturation volume that can no longer be excited for imaging, and subsequently the actual excitation pulse in the entire volume or a volume slice, thus also in the region of the saturated volume, but no image information can be acquired due to the dephasing.

This excitation sequence is time-consuming because two separate pulses must be provided. Moreover, a relatively large amount of energy is radiated into the patient, which increases the specific absorption rate SAR, which is associated with limitations with regard to the number of slices, the repetition time or the measurement time. The problem also exists that the dephased magnetization may possibly be re-phased with the subsequent excitation pulse, such that in spite of the saturation pulse it can contribute to the image information as an image artifact.

A magnetic resonance apparatus is known from DE 101 24 465 A1 with a body coil having a number of resonator segments distributed around the circumference and electromagnetically decoupled from one another. Separate transmission channels are respectively associated with the resonator segments such that the phase and the amplitude of the RF feed can be individually predetermined for each resonator segment, which enables a nearly complete control of the radio-frequency field distribution in the examination volume.

Another method for operation of a magnetic resonance apparatus is known from DE 10 2004 002 009 A1, in which the $B_1$ field (RF field) distribution is measured in at least one sub-region of an examination volume of a radio-frequency antenna of the magnetic resonance apparatus, and the RF pulses emitted by the radio-frequency antenna for homogenization in a specific volume are then optimized on the basis of the determined $B_1$ field distribution. For this purpose, an effective volume within the examination volume is determined beforehand for each applied RF pulse and individual adjustment on the basis of the determined $B_1$ field distribution for the appertaining RF pulse in that volume is undertaken, such that the $B_1$ field is homogenized within the effective volume of the RF pulse. A best-possible mode of operation of each applied RF pulse is thereby achievable. The radio-frequency antenna itself has a number of individual antenna elements, and in the framework of the described pulse mode optimization the $B_1$ field is respectively measured separately for all antenna elements in order to determine the effect of the individual antenna elements within the examination volume.

SUMMARY OF THE INVENTION

An object of the present invention is to improve a magnetic resonance apparatus so that the timing problems resulting from the emission of an additional saturation pulse and the problems with regard to increasing SAR exposure are no longer present.

This object is achieved in accordance with the present invention by a magnetic resonance apparatus of the type described above wherein the resonator segments are controlled such that the RF field can be generated only in at least one first sub-volume forming the examination volume, and at least one second sub-volume, that is not to be excited, is essentially free of the RF field.

The invention is based on the recognition that, given the use of a body coil composed of separately-activatable resonator segments, it is possible to generate a homogeneous radio-frequency magnetic field not only in the entire coil volume but also, by individual segment activation and superimposition of the individual fields that result from the activation of each individual segment, the homogeneous excitation magnetic field can be generated only in one sub-volume of the entire coil volume while the other sub-volume is free of the RF field. With particular advantage, this enables the excitation field to thus be "tailored" or to be shaped and to be generated only in the region in which the spin excitation should actually ensue in the patient, thus in the region in which image information should actually be read out. Referring to the aforementioned application example in the case of a spinal column acquisition that can be impaired by the abdominal wall movement, it would thus be possible to generate the homogeneous, radio-frequency magnetic field only in a region that includes the spinal column but that does next extend to the region of the abdominal wall. No excitation field is generated in this region (the second sub-volume) or such a low field is generated that this sub-volume is to be considered as free of a magnetic field; consequently, no spin excitation that would provide an image occurs in this region.

Because the RF field is also generated or excited only where the image should be acquired, or where image information should be read out, in the inventive magnetic resonance apparatus as a consequence of the defined, locally-delimited excitation field generation, the use of the saturation pulse required in the prior art is no longer necessary. The sequence workflow consequently can be accelerated and the specific absorption rate (SAR) is inevitably reduced because the saturation pulse is not emitted. The occurrence of artifacts that can also result as described from a rephasing in the prior art is advantageously avoided.

The resonator segments can be activated such that a number of separate magnetic fields can be generated in first sub-volumes separated from one another. The possibility thus exists, for example, to generate two magnetic fields separated from one another, between which the volume is essentially field-free. Alternatively, it is possible that only one magnetic field is generated, however this is formed such that two or more field-free second sub-volumes result.

The ability to design the magnetic field in terms of its shape to (extent) the actual examination requirements or to be able to shape it in terms of the size and geometry also offers that advantage to generate the magnetic field in an arbitrary form, for example relative to a radial plane situated orthogonally to the coil longitudinal axis; this means that the magnetic field can be designed differently in its radial geometry by corresponding activation of the resonator segments, so that the field geometry can be correspondingly adjusted dependent on the image region to be acquired. A segmentation along the coil axis is also possible given use of corresponding array structures.

In addition to the magnetic resonance apparatus, the invention also concerns a method for generation of a radio-frequency field serving for spin excitation in an examination volume within a cylindrical body coil of an magnetic resonance apparatus, the body coil being formed by a number of resonator segments distributed around the circumference, and a control device for separate activation of the individual resonator segments, the resonator segments being electromagnetically decoupled from one another. In the inventive method, the resonator segments are activated such that the magnetic field is generated only in at least one first sub-volume forming the examination volume, and at least one second sub-volume that is not to be excited is essentially free of the excitation field.

One possibility for generating the arbitrarily-designed field is described, for example, in German patent application DE 10 2004 045 691.7 (U.S. Ser. No. 10/974,408), the teachings of which are incorporated herein by reference. In this patent application a method is described for generation of a homogeneous radio-frequency magnetic field in a spatial examination volume of a magnetic resonance system using a body coil having N resonator segments and a control and evaluation device for separate activation of the individual resonator segments, that are electromagnetically decoupled from one another. In order to be able to generate a homogeneous field, all resonator segments are excited individually or in groups for generation (using defined excitation parameters) of a corresponding number of linearly independent RF field distributions in the examination volume in an examination subject located in the magnetic resonance system. The specific field distribution in the examination volume is acquired for each individual excitation, after which the resonator segments are excited dependent on the determined parameter alteration to acquire the examination image. An alternative to the real segment excitation and acquisition of real magnetic field distributions, that are subsequently superimposed and evaluated with regard to the overall field distribution, is to simulate the individual excitations and consequently to acquire simulated field distributions and to superimpose them relative to the simulated overall field distribution, and subsequently to evaluate them.

On the basis of such a procedure it is possible (if applicable, with repetition of the steps of the computational superimposition, the homogeneity evaluation and the determination of the parameters (iterative optimization)) to fashion or to shape the RF field corresponding to the clinical question, thus corresponding to the actual examination volume to be acquired, and to simultaneously minimize the field formation in the second sub-volume. For example, if the excitation field for a spinal column acquisition should be generated only in the lower region of the coil volume, such that the abdominal wall is not situated in the excitation field, the described parameter determination ensues such that just this field geometry is set, by excitation of a few or all resonator segments. For each resonator segment, the corresponding excitation parameters (starting from a normal excitation as a basis of, for example, the iterative parameter prioritization) are determined that cause the individual fields to be generated such that the overall field distribution is adjusted, such that only the desired sub-volume is excited, or the excitation field is generated only in the desired sub-volume, while the other volume region is essentially field-free. Using a changed, optimized set of excitation parameters, a subject-specific excitation of the resonator segments that is thus dependent on the examination subject can ensue for generation of a locally-optimized, geometrically optimally-shaped, polarized magnetic field with maximum homogeneity. Using such a procedure, the inventive magnetic resonance apparatus and method allow a simple and fast generation of an excitation field with maximum homogeneity in the examination volume, defined by the excitation field sub-volume. Complete scanning by simultaneous or time-offset grouped or individualized activation of only the resonator segments necessary to acquire the individual fields is required for this purpose. A diagnostic patient exposure is not needed. The parameters required for the subsequent diagnostic image acquisition can be determined in a simple and fast manner. Since the evaluation algorithm serves for the optimization of the excitation field with regard to its homogeneity, the image acquisition can ensue on the basis of an optimally homogeneous excitation field, such that the maximum information yield is possible from the limited examination volume without inhomogeneities of the image quality resulting from the non-excitation of other volume regions that are not of interest.

An excitation-specific magnetic resonance image (using which the excitation field curve is reconstructed) can be acquired in connection with the acquisition of the segment-specific magnetic field distributions for each individual segment excitation. To determine the segment-specific magnetic field distribution with regard to each segment excitation, the associated MR image is acquired from the examination volume, from which the radio-frequency magnetic field distribution (known as the B1 field distribution) can then be reconstructed with regard to the segment excitation, this reconstruction result subsequently entering into the determination of the overall field distribution.

As described, the possibility exists to also conduct a simulated field optimization or excitation optimization instead of a field optimization with an inserted patient, whereby in this case the model operates with a digitized human model or phantom that represents the inserted patient and that approximates the real patient optimally well.

In the assessment of the homogeneity of the overall field distribution for the inventive method, or in the operation of the inventive magnetic resonance system using the evaluation algorithm according to DE 10 2004 045 691.7, one or more limit values can also be taken into account for the local specific absorption rate of the examination subject. A limit value for the global specific absorption rate in the examination subject also can be considered. In the present invention, this is appropriate because given a comparably strong basic magnetic field of, for example, 3T, the excited field must be generated at very high frequencies, for example 128 MHz given a 3T basic magnetic field. Due to the high frequencies and the low penetration depth thereof, stronger inhomogeneities result that lead to the spin flip across the examination volume not being sufficient. A stronger heating of the body also results in addition to this due to the higher energy application. This increased energy application can itself not be arbitrarily high locally with regard to the examination volume, nor globally with regard to the examination volume. In the MR examination, limit values must be adhered to in order to not too severely expose the patient. The local specific absorption rate (SAR) is the local energy application per weight unit and is specified as a loss power per kilogram of weight, while the global absorption rate represents the total loss power with regard to the total weight of the examination subject. For example, the global absorption rate can lie below the limit value while the local absorption rate exceeds the limit value in a specific point of the examination volume, and this can lead to a localized burning of the patient, which must be avoided in the inventive sub-volume-specific field generation. In this context, the evaluation algorithm can take into account one or more predetermined limit values with regard to the local and/or the global absorption rate in order to ensure that the determined excitation parameters are such that neither the local nor the global absorption rate is exceeded. This yields an excitation parameter set that is optimized with regard to the size and shape of the sub-volume to be excited, the field homogeneity in this sub-volume, as well as with regard to adherence to the absorption or energy application limit values.

The assessment of the homogeneity of the overall field distribution in the inventively-profiled sub-volume excitation field appropriately ensues using the amplitudes and phases of the linearly-independent field distributions. The evaluation algorithm (realized as software) adopts the numerical values for amplitudes and phases of the measured or simulated fields occurring given excitation of only one resonator segment, or given a segment group excitation of the respective segment groups. On the basis of these values it is subsequently determined with which amplitudes and phases the individual resonator segments or groups must be activated in order to shape the field geometry as desired, and to compensate an established inhomogeneity in the sub-volume magnetic field and to achieve a maximal homogeneity of the circular polarized magnetic field components.

In this assessment and determination, the amplitudes and phases can be used in different ways to compensate the inhomogeneity. The activation of the individual activation ports of the segments or segment groups is achieved according to the requirement of the numerical results of the optimization algorithm in the form of amplitudes and phases with which the individual resonator segments or segment groups are to be activated for geometrically-defined field generation with maximum homogeneity. The inputs or activation ports can be activated via power splitters and phase shifters. As an alternative, a regulated amplifier can be used for each individual activation port.

DESCRIPTION OF THE PREFERRED EMBODIMENTS

Figure 1:
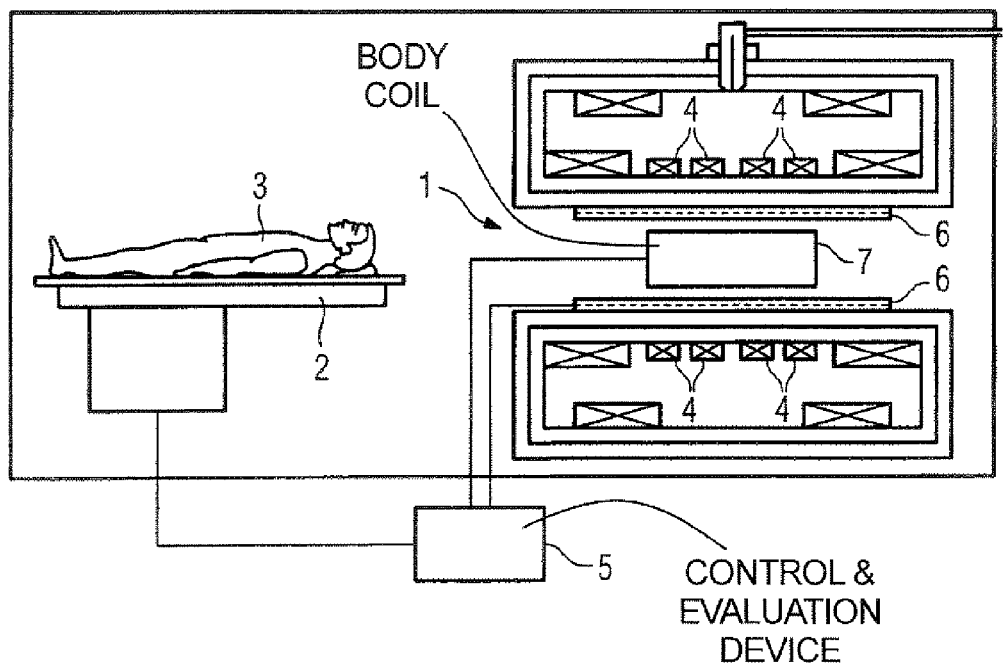
FIG. 1 is a block diagram of a magnetic resonance system.

FIG. 1 shows an inventive magnetic resonance examination system that has an examination region 1. An examination subject 3 (here a person) can be introduced into the examination region 1 by means of a patient bed 2. The examination region 1 that corresponds to the examination volume is charged with a basic magnetic field by means of a basic field magnet 4. The basic magnetic field is temporally constant (static) and spatially as homogeneous as possible. It exhibits a magnetic field strength that is advantageously 3 T or more.

The basic field magnet 4 can be fashioned as a superconductor. No further activations by a control and evaluation device 5 (via which the system operation is controlled) are thus necessary.

The magnetic resonance system also has a gradient system 6 by means of which the examination region 1 can be charged with gradient magnetic fields. The gradient system 6 can be activated by the control and evaluation device 5, such that gradient currents flow in the gradient system 6.

The magnetic resonance system also has a body coil 7 that normally takes on a dual function. It serves as a transmission antenna for field generation and as a reception antenna for acquisition of signals. The body coil 7 can be activated by the control and evaluation device 5 such that suitable excitation currents flow therein corresponding to the excitation parameters as that exist in the control and evaluation device 5.

The examination region 1 (thus the examination volume) can be charged with a radio-frequency excitation field by means of the body coil 7. If the examination subject 3 is introduced into the examination region 1, the subject 3 this is excited to magnetic resonance. In the shown system example, the magnetic resonance signals so generated are then acquired via the body coil 7, which then operates as a reception antenna. The acquired magnetic resonance pulses are supplied to the control and evaluation device 5 and evaluated by this device to generate the magnetic resonance image that is output on a monitor (not shown in detail).

The quality of the magnetic resonance images depends on, among other things, the homogeneity of the excitation field generated by the body coil 7. In order to be able to generate an optimal (with regard to the homogeneity) excitation field, the individual resonator segments 8 of the body coil 7 can be activated separate, meaning that each resonator segment can be individually activated for field generation.

Figure 2:
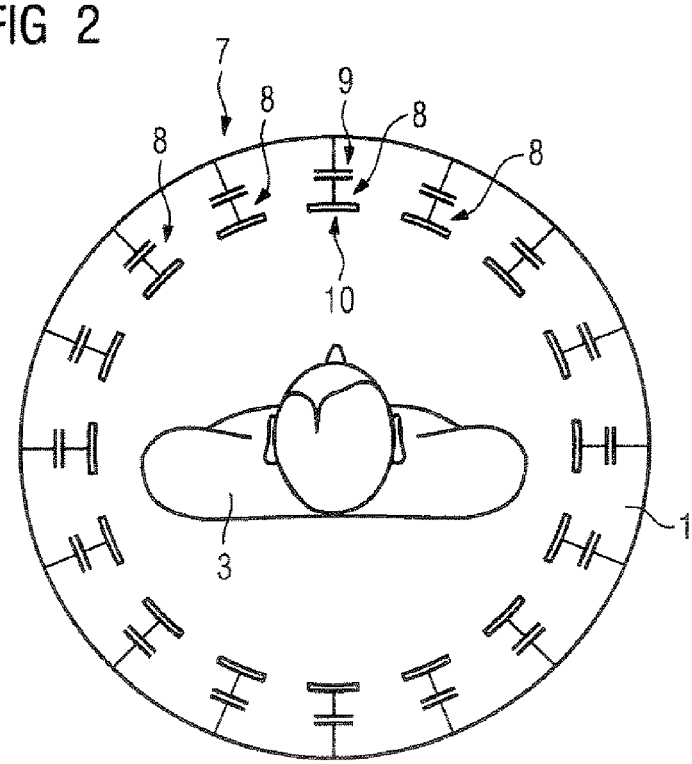
FIG. 2 shows a section through a body coil.

As FIG. 2 shows, a cylindrical body coil 7 has a number of individual resonator segments; sixteen resonator segments 8 are provided in the exemplary embodiment. As an alternative to the cylinder shape, the body coil can exhibit an oval cross-section or a cross-section deformed in another manner. Each resonator segment has at least one capacitor 9 as well as a conductor element 10 that, for example, proceeds parallel to the longitudinal axis of the basic field magnet 4. A conductor element is appropriately fashioned as a band conductor. The resonator segments 8 are arranged such that they surround the examination region 1 (thus the examination volume).

So that the resonator segments 8 can be activated separately, it is necessary to electromagnetically decouple them from one another. This can ensue in different ways. EP 1 279 968 A2 discloses examples of various decoupling possibilities can be used in the inventive magnetic resonance system (although not described here in detail).

Figure 3:
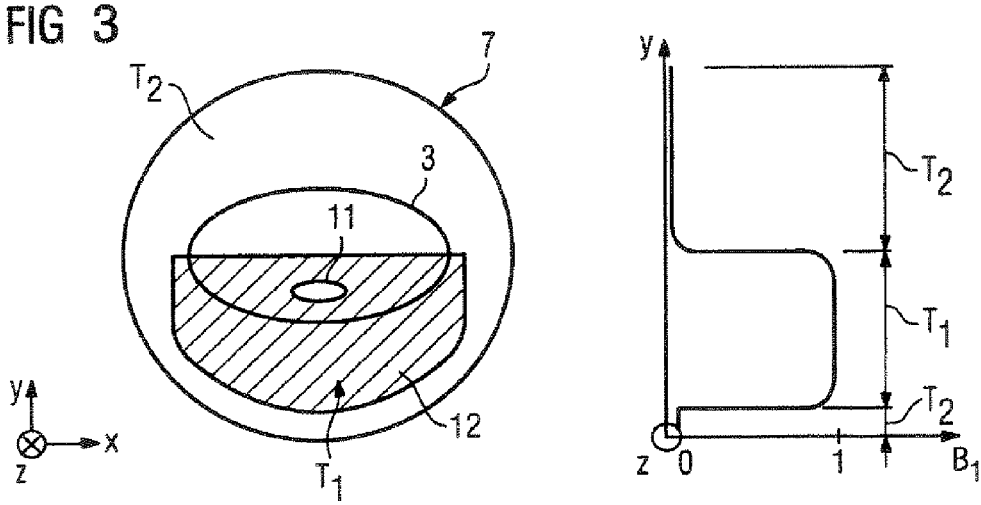
FIG. 3 shows an exemplary embodiment of a local, volume-specific excitation field generation in accordance with the invention.

FIG. 3 shows the inventive volume-specific magnetic field generation. The body coil 7 is shown without the individual resonator segments, as well as the stylized examination subject 3 introduced into the body coil 7, in which examination subject 3, for example, an examination and an image acquisition of the spinal column 11 should ensue. So that the image acquisition can ensue without artifacts, it is necessary to prevent image artifacts that can arise from a respiration-conditional movement of the abdominal wall or via fold-over effects. For this purpose, the B1 magnetic field 12 is generated only in a specific sub-volume T1 shown as an example in FIG. 3, and naturally not being sharply delimited. FIG. 3 serves merely for schematically representation of the volume-specific field generation. The sub-volume T1 (which is the actual examination volume within which a spin excitation in the examination subject can actually ensue and that coincides with the shape of the B1 magnetic field 12) is shown, spatially delimited with regard to the examination subject 3; it directly includes the region of the spinal column 11. The region of the examination subject 3 situated above this is located outside of the B1 magnetic field; it lies in the sub-volume T2 that extends over the remaining coil volume and that is essentially free of B1 magnetic fields. The term "essentially free of B1 magnetic fields" is understood as meaning that no field that would be sufficient to generate a spin deflection or spin excitation, that would have an imaging influence in any form at all, is generated in this region from the corresponding resonator segment activation. It cannot be avoided that a minimal field may be emitted in this region, but in any case this has a strength such that, as described, no impairment occurs in the image acquired in the actual examination volume corresponding to the sub-volume T1.

A diagram for representation of the B1 magnetic field or B1 field amplitude is also shown in FIG. 3. The y-axis (defined by the adjoining x, y, z coordinate system) is shown along the ordinate, the z-axis is shown running into the drawing plane and the B1 amplitude is shown along the x-axis. The B1 field amplitude is approximately 0 in the region of the second, virtually field-free sub-volume T2, while it is maximal (here normalized to 1) in the region of the first excitation sub-volume T1. This means that a field amplitude excitation ensues exclusively in the volume region T1, but not in the other volumes.

From FIG. 3 it can be seen that it is possible to differently design the radial geometry (relative to the z-axis) of the magnetic field 12. In the shown example, the field geometry is selected such that the region of the spinal column 11 directly lies in the excitation field. In this case, this shape is dependent on the examination region that should be acquired. If, for example, the head were to be acquired and the brain should be examined, it would thus be possible to shape the magnetic field 12 such that it is generated to be spin-tilting (and therewith exciting), and existing homogeneously, only inside the calvaria, but not in the region of the fat border that would in turn interfere and which is saturated in the prior art by sequentially-emitted saturation pulses, such that it no longer participates in the imaging. By the inventively arbitrary magnetic field formation by corresponding activation of the resonator segments dependent on the shape, position or type of the exposure, the emission of saturation pulses is unnecessary; the magnetic field can be generated precisely in the region that should actually be acquired. Limitation to segmentation only with regard to the radial plane is, however, not provided since a segmentation along the coil axis is also possible given use of suitable array structures.

Figure 4:
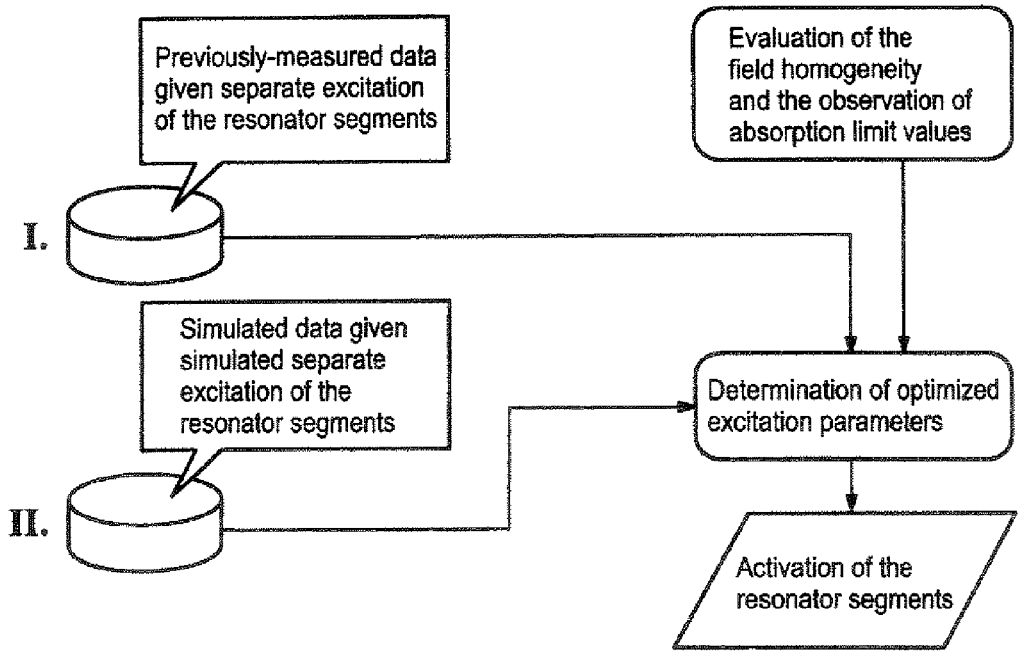
FIG. 4 is a flow chart for determination of the optimized excitation parameters.

FIG. 4 shows the basic workflow as to how optimized excitation parameters can be acquired. Beginning at I, according to the first described method alternative the possibility exists to initially separately activate each resonator segment 8 (controlled via the control and evaluation device) with normalized activation parameters. For example a sinusoidal normal current with an amplitude of 1 A and a phase of 0° can be used. This is to acquire a two-dimensional or three-dimensional magnetic resonance image resulting from the activation for each resonator segment after switching over to the reception operation via the body coil 7.

After this has ensued for all resonator segments 8, the control and evaluation device 5 determines (on the basis of an evaluation and optimization algorithm) the respective segment-specific individual magnetic distributions with regard to each individual excitation. The evaluation and optimization algorithm, which is realized as software, detects the numerical values of the amplitudes and phases of the fields occurring given the excitation of respectively only one individual resonator segment, which ensues via analysis of the individual magnetic resonance images and reconstruction of the individual fields. The algorithm can simultaneously offer to the user the possibility to interactively define the spatial examination volume to be examined in terms of dimension and shape. After the individual fields are determined, the overall field distribution in the examination volume (which the user has possibly defined) is computationally determined by superimposing the individual field distributions. The evaluation algorithm with which this occurs takes into account suitable evaluation criteria via which the homogeneity can be determined. For example, this can ensue on the basis of deviations of the amplitude or phases of the individual fields of standard values or the like. Suitable evaluation possibilities were described above. The assessment of the overall field distribution on the basis of one or more limit values that define the local and/or global absorption rates that may not be exceeded simultaneously ensues parallel to the homogeneity determination.

Furthermore, the evaluation algorithm is designed such that only a minimal B1 field is emitted in the at least one second sub-volume. It is the goal of the evaluation to optimize the excitation parameters of each individual resonator segment 8 such that a homogeneous field is generated in the examination volume given simultaneous minimization of the B1 field in a second sub-volume, while insuring that the absorption limit values are in no exceeded.

If the parameter set for activation of the individual resonator segments has now been determined, these can be activated with these parameters for generation of a circularly polarized field with optimal homogeneity, minimal B1 field in the adjoining sub-volume or sub-volumes, and simultaneous adherence to the local/global absorption limit values.

An alternative to the actual individual segment excitation is designated II. The individual fields resulting from a possible individual segment excitation are hereby simulated. For this purpose, corresponding simulation models both of the magnetic resonance system and also of an examination subject 3 that should form the basis of the examination are present on the part of the control and evaluation device, whereby the simulation data with regard to the examination subject 3 optimally corresponds to the subject who is to be examined next so that the parameter determination can ensue optimally close to the actual relationships.

After the individual field distributions have been determined here on the basis of normalized excitation parameters, the resulting overall excitation field is likewise determined by superimposing the individual fields and subsequently examined for possible field homogeneities using the evaluation algorithm, and the ultimate set of excitation parameters to be set for the optimized field generation is determined.

Although modifications and changes may be suggested by those skilled in the art, it is the intention of the inventors to embody within the patent warranted hereon all changes and modifications as reasonably and properly come within the scope of their contribution to the art.

I claim as my invention:

1. A magnetic resonance apparatus comprising:
 a magnetic resonance data acquisition device having a body coil configured to surround an examination subject, said body coil comprising a plurality of resonator segments distributed around said circumference, said resonator segments being electromagnetically decoupled from each other, said examination subject occupying a volume within said body coil comprising a first sub-volume in which the subject exhibits substantially no movement and at least one second sub-volume in which the subject exhibits movement;
 a control device that operates said magnetic resonance data acquisition device and that is connected to said body coil, and that excites magnetic resonance spins substantially only in said first sub-volume by individually activating the respective resonator segments thereof to generate a radio-frequency field substantially only in said first sub-volume, and to maintain said at least one second sub-volume within said circumference substantially free of said radio-frequency field; and
 said control unit operating said magnetic resonance data acquisition device exciting magnetic resonance spins substantially only in said first sub-volume to acquire magnetic resonance data produced by said magnetic resonance spins, in a form allowing reconstruction of an image of the subject in the first sub-volume, said data being substantially free of image artifact-causing aberrations as a result of being produced substantially only in said first sub-volume.

2. A magnetic resonance apparatus as claimed in claim 1 wherein said body coil is a cylindrical body coil.

3. A magnetic resonance apparatus as claimed in claim 1 wherein said body coil has a longitudinal axis, and wherein said control unit individually activates said resonator segments to generate said radio-frequency field in said first sub-volume with an arbitrarily selectable shape relative to a radial plane oriented orthogonally to said longitudinal axis.

4. A magnetic resonance apparatus as claimed in claim 1 wherein said control unit individually activates said resonator segments to generate a plurality of separate radio-frequency fields in different portions of said first sub-volume, said different portions being separated from each other.

5. A magnetic resonance apparatus as claimed in claim 1 wherein said control unit individually activates said resonator segments to produce a plurality of sub-volume that are substantially free of said radio-frequency field.

6. A method for operating a magnetic resonance apparatus comprising the steps of:
 surrounding an examination subject in a magnetic resonance data acquisition device with a body coil comprising a plurality of resonator segments distributed around said circumference, said resonator segments being electromagnetically decoupled from each other, said examination subject occupying a volume within said body coil comprising a first sub-volume in which the subject exhibits substantially no movement and at least one sub-volume in which the subject exhibits movement;
 via a control device, exciting magnetic resonance spins substantially only in said first sub-volume by individually activating the respective resonator segments thereof to generate a radio-frequency field substantially only in said first sub-volume and to maintain said at least one second sub-volume substantially free of said radio-frequency field, and to acquire magnetic resonance data produced by said magnetic resonance spins, in a form allowing reconstruction of an image of the subject in the first sub-volume, said data being substantially free of image artifact-causing aberrations as a result of being produced substantially only in said first sub-volume.

7. A method as claimed in claim 6 comprising surrounding said examination subject with a cylindrical body coil, as said body coil.

8. A method as claimed in claim 6 wherein said body coil has a longitudinal axis and, via said control unit, individually activating said resonator segments to generate said radio-frequency field in said first sub-volume with an arbitrarily selectable shape relative to a radial plane oriented orthogonally to said longitudinal axis.

9. A method as claimed in claim 6 comprising, via said control unit, individually activating said resonator segments to generate a plurality of separate radio-frequency fields in different portions of said first sub-volume, said different portions being separated from each other.

10. A method as claimed in claim 6 comprising, via said control unit, individually activating said resonator segments to produce a plurality of second sub-volumes that are substantially free of said radio-frequency field.

* * * * *